(12) United States Patent
Cho et al.

(10) Patent No.: US 10,535,514 B2
(45) Date of Patent: Jan. 14, 2020

(54) METHOD OF SEALING OPEN PORES ON SURFACE OF POROUS DIELECTRIC MATERIAL USING ICVD PROCESS

(71) Applicants: Korea Advanced Institute of Science and Technology, Daejeon (KR); Lam Research Corporation, Fremont, CA (US)

(72) Inventors: Byung Jin Cho, Daejeon (KR); Sung Gap Im, Daejeon (KR); Seong Jun Yoon, Daejeon (KR); Kwanyong Pak, Daejeon (KR); Hyungsuk Alexander Yoon, San Jose, CA (US)

(73) Assignees: Korea Advanced Institute of Science and Technology, Daejeon (KR); Lam Research Corporation, Fremont, CA (US)

( * ) Notice: Subject to any disclaimer, the term of this patent is extended or adjusted under 35 U.S.C. 154(b) by 0 days.

(21) Appl. No.: 15/247,817

(22) Filed: Aug. 25, 2016

(65) Prior Publication Data

US 2017/0358488 A1    Dec. 14, 2017

(30) Foreign Application Priority Data

Jun. 10, 2016  (KR) ........................ 10-2016-0072244

(51) Int. Cl.
*H01L 21/02*  (2006.01)
(52) U.S. Cl.
CPC .............................. *H01L 21/02321* (2013.01)

(58) Field of Classification Search
CPC ................................................. H01L 21/02321
See application file for complete search history.

(56) References Cited

U.S. PATENT DOCUMENTS

| | | | |
|---|---|---|---|
| 7,256,499 B1 * | 8/2007 | You ..................... | H01L 23/5226 257/758 |
| 8,968,864 B2 | 3/2015 | Goethals et al. .......... | 428/316.6 |
| 9,058,980 B1 | 6/2015 | Xie et al. ..................... | 438/758 |
| 2012/0003497 A1 * | 1/2012 | Handy ..................... | B05D 1/34 428/615 |
| 2013/0171546 A1 * | 7/2013 | White ..................... | B05D 1/60 429/508 |
| 2016/0056071 A1 * | 2/2016 | Draeger ............ | H01L 23/53238 438/653 |

OTHER PUBLICATIONS

Trujillo et al. ("Ultralow Dielectric Constant Tetravinyltetramethylcyclotetrasiloxane Films Deposited by Initiated Chemical Vapor Deposition (iCVD)" Advanced Functional Materials 2010 20, 607-616.*

(Continued)

*Primary Examiner* — Robert S Walters, Jr.
(74) *Attorney, Agent, or Firm* — Penilla IP, APC

(57) ABSTRACT

Provided are methods of sealing open pores of a surface of a porous dielectric material using an initiated chemical vapor deposition (iCVD) process. In one example method of sealing open pores, since the polymer thin film having a significantly thin thickness may be formed by a solvent-free vapor deposition method without plasma treatment, it is possible to minimize deterioration of characteristics of the dielectric material vulnerable to plasma and a chemical solution.

8 Claims, 4 Drawing Sheets

(56) References Cited

OTHER PUBLICATIONS

Gleason "Overview of Chemically Vapor Deposited (CVD) Polymers" Book Chapter in "CVD Polymers: Fabrication of Organic Surfaces and Devices" 1st Edition Aug. 2015.*

Olawumi et al., *"Modification of Ultra Low-k Dielectric Films by $O_2$ and $CO_2$"*, ECS Journal of Solid State Science and Technology, 4 (1) N3048-N3057, 2015. Published Oct. 18, 2014.

* cited by examiner

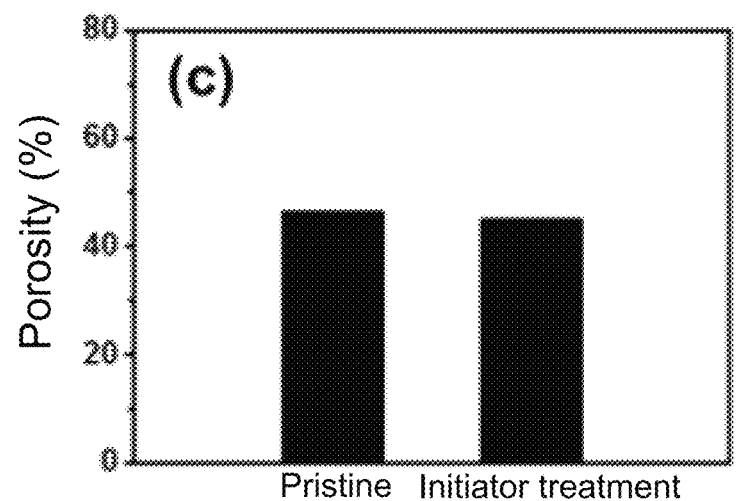
FIG. 5
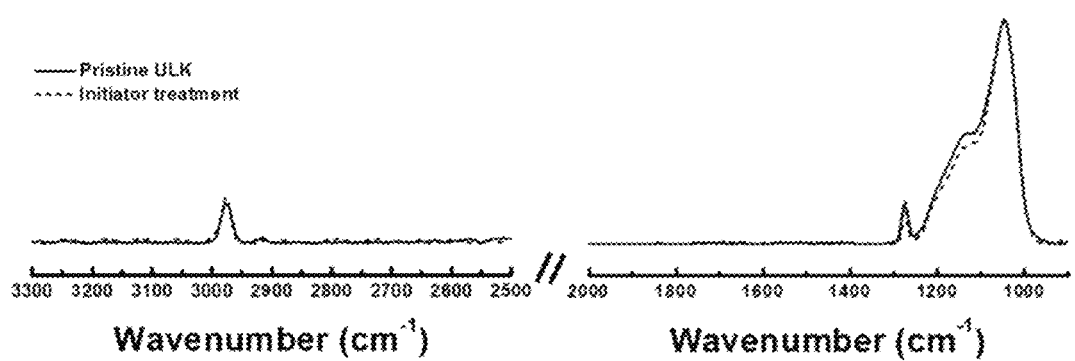
FIG. 6A
FIG. 6B

METHOD OF SEALING OPEN PORES ON SURFACE OF POROUS DIELECTRIC MATERIAL USING ICVD PROCESS

CLAIM OF PRIORITY

This Application claims priority to Korean Patent Application No. 10-2016-0072244 filed on Jun. 10, 2016, entitled "Method of Sealing Open Pores on Surface of Porous Dielectric Material," which is incorporated by reference herein.

TECHNICAL FIELD

The following disclosure relates to a novel method of sealing open pores on a surface of a porous dielectric material using an initiated chemical vapor deposition (iCVD) process.

BACKGROUND

As a minimum feature size of a semiconductor device decreases, a minimum pitch size between metal lines needs to be gradually reduced. Between the metal lines, a dielectric material is inserted in order to block an unintended current path. However as the minimum pitch size decreases, an increase in line-to-line capacitance is unavoidable because of the shorter space between the metal lines. The increase in line-to-line capacitance causes an increase of RC-delay, cross-talk noise, and power dissipation, thereby deteriorating performance of the device. In order to decrease the capacitance between the metal lines, a dielectric material having a low dielectric constant should be introduced. As an example thereof, there is a carbon doped oxide (CDO) film. As rigid Si—O—Si bonds of silicon dioxide ($SiO_2$) used in the related art are partially broken and terminal bonds such as Si—$CH_3$ having a relatively low polarity are formed instead of the broken Si—O—Si bonds, the CDO film has a relatively low effective dielectric constant ($k_{eff}$). In addition, a dielectric film having a further low $k_{eff}$ value, especially 2.4 or less, can be obtained by introducing a porosity into the CDO film, because of the lowest dielectric constant of air, which is around 1. However, the connectivity and density of the porous dielectric material decreases by introducing the porosity, such that a mechanical and chemical strength of the dielectric material significantly decreases, and moreover, the dielectric material becomes extremely vulnerable to a process-related damage. In general, pores introduced in the porous material are mutually interconnected. Therefore, plasma and chemical species, moisture, metal particles can deeply penetrate into the porous film through the mutually interconnected pores. This may result in increases of $k_{eff}$ and leakage current of the porous material.

Therefore, a pore sealing technology is an essential technology for forming a porous low-k/ultra-low k dielectric layer in a fine pitch interconnect structure having a fine line width.

As a method known in the art, there is a densification method of a surface of a porous low-k/ultra-low k film using plasma. However, this method has a disadvantage in that plasma can cause a damage in the porous low-k/ultra-low k film to degrade the original characteristics of the film, such as increasing the dielectric constant of the film. Furthermore, in a case of increasing porosity to decrease the dielectric constant of the porous low-k/ultra-low k film, a portion of the film damaged due to the penetration of plasma species also increases.

As another method, there is a deposition method of a dense sealing layer on a surface of a porous low-k/ultra low-k dielectric material. However, this method has a disadvantage in that as a porosity of the porous low-k/ultra-low k film increases, a penetration depth of the sealing material into the film also increases. Furthermore, in some cases, it may be difficult to deposit a conformal sealing layer on a porous low-k/ultra-low k dielectric film having a trench/via structure with a high aspect ratio depending on the deposition method.

In addition to the above method, if the deposition method is based on a spin coating technology, there can be a solvent residue problem.

SUMMARY

An embodiment of the present invention is directed to providing a method of sealing open pores on a surface of a porous dielectric material capable of minimizing damage during a deposition of a pore sealing layer.

In addition, another embodiment of the present invention is directed to providing a method of sealing open pores capable of decreasing an open porosity while minimizing a decrease of entire porosity of the porous dielectric material by selectively decreasing a porosity of a surface of the porous dielectric material.

The present invention suggests a novel method of sealing open pores on a surface of a porous material, for example, a porous dielectric material configuring a semiconductor device. In more detail, the present invention suggests a novel method of sealing open pores formed on a surface of a low-k porous dielectric material having a k of 2.4 to 3.6 or an ultra low-k porous dielectric material having a k less than 2.4.

A sealing layer may be made of a polymer in which a monomer or an oligomer including at least one vinyl group is polymerized, and be formed by initiated chemical vapor deposition (iCVD).

In one general aspect, a method of sealing open pores on a surface of a porous dielectric material using an initiated chemical vapor deposition (iCVD) process includes: a) positioning the porous dielectric material on a substrate; and b) thermally decomposing an initiator to form a free radical by heating while injecting a vaporized monomer and initiator, and sealing the open pores on the surface of the porous dielectric material to form a polymer thin film by allowing the free radical to activate the monomer and induce a chain polymerization reaction.

Step b) may be repetitively performed two times or more.

Step a) and step b) may be performed in a vapor-phase reactor in a vacuum chamber environment.

A substrate temperature may be 10 to 400° C. a chamber pressure may be 50 to 2500 mTorr, a deposition time may be 1 to 3600 seconds, and a thermal decomposition temperature of the initiator may be 100 to 300° C.

The initiator may be a peroxide based initiator, and the monomer may be a siloxane based monomer including at least one vinyl group, a silazane based monomer including at least one vinyl group, or an acrylic monomer.

The monomer may be any one selected among 1,3,5-trimethyl-2,4,6-trivinyl cyclotrisiloxane, 2,4,6-trimethyl-2,4,6-trivinylcyclotetrasilazane, 2,4,6,8-tetramethyl-2,4,6,8-tetravinylcyclotetrasiloxane, perfluorodecyl acrylate, cyclohexyl methacrylate, and isobornyl acrylate, or a mixture thereof.

In the porous dielectric material, a dielectric constant $k_1$ before sealing the surface and a dielectric constant $k_2$ after sealing the surface may satisfy the following Equations 1 and 2, and an open porosity $P_1$ before sealing the surface and open porosity $P_2$ after sealing the surface may satisfy one or more of the following Equations 1 to 4, and in one embodiment satisfy Equations 3 and 4.

$$1.8 \le k_1 \le 3.6 \qquad \text{[Equation 1]}$$

$$0 \le |k_1 - k_2| \le 1 \qquad \text{[Equation 2]}$$

$$10\% \le P_1 \le 60\% \qquad \text{[Equation 3]}$$

$$0\% \le P_2 \le 40\% \qquad \text{[Equation 4]}$$

In step b), at the time of injecting a vaporized or sublimated monomer and initiator, any one or two or more carrier gases selected among Ar, $N_2$, and He may be used.

The method may further include, after step b), performing post-bake treatment at 60 to 400° C.

The method may further include performing post-bake treatment at 60 to 400° C. between each of the polymer thin film deposition steps at the time of repeating step b) two times or more.

BRIEF DESCRIPTION OF THE DRAWINGS

FIG. 5 is a graph illustrating open porosities of the pristine and initiator treated ULK dielectric materials.

FIGS. 6A and 6B illustrate Fourier transform-infrared (FT-IR) spectra of the pristine and initiator treated ULK dielectric materials.

DETAILED DESCRIPTION OF EMBODIMENTS

Figure 1A:
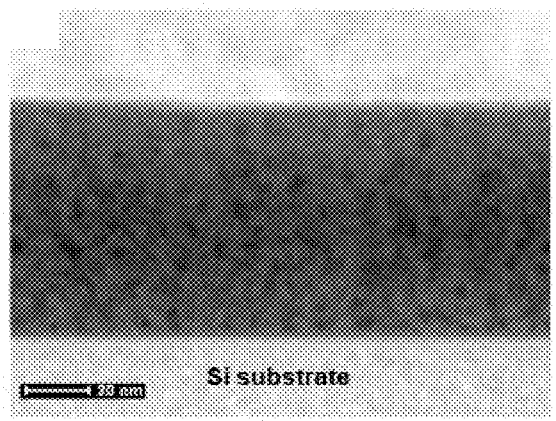
FIGS. 1A and 1B are scanning transmission electron microscopy (STEM) images in which it may be confirmed that a polymer thin film was formed on a surface of a porous dielectric material.

Hereinafter, the present invention will be described in more detail through detailed examples or exemplary embodiments including the accompanying drawings.

However, the following detailed examples or exemplary embodiments are only to specifically explain the present invention. Therefore, the present invention is not limited thereto, but may be implemented in various forms.

In addition, unless defined otherwise in the specification, all the technical and scientific terms used in the specification have the same meanings as those that are generally understood by those who skilled in the art. The terms used in the specification are only to effectively describe a specific exemplary embodiment, but are not to limit the present invention.

In addition, unless the context clearly indicates otherwise, it should be understood that a term in singular form used in the specification and the appended claims includes the term in plural form.

Hereinafter, as used herein, the term 'porosity' may include all porosities present in a porous dielectric material, that is, both an open porosity and a closed porosity.

As used herein, the term 'open porosity' means a porosity of pores mutually interconnected to each other or connected to the outside to thereby be accessible to foreign materials (e.g., gas or chemical species). The term 'closed porosity' means a porosity of completely closed pores which are inaccessible to the outside.

As used herein, the term 'polymer thin film' includes both a thin film formed in the porous dielectric material by introduction of the monomer into the open pore on the surface of the porous dielectric material and a thin film formed on the surface of the porous dielectric material to seal the open pore.

The initiated chemical vapor deposition (iCVD) process using an initiator is a process of vaporizing a volatile monomer and the initiator to form a polymer thin film through a vapor-phase polymerization reaction in which a polymerization reaction of a polymer and a formation of a film are simultaneously performed.

The iCVD process is a process of forming the polymer thin film on the substrate by activating the vaporized monomer in a vapor-phase reactor to perform a polymer polymerization reaction, and in the iCVD process, the polymer polymerization reaction and deposition of the thin film are simultaneously performed.

When the initiator and the monomer are simply mixed with each other, the polymerization does not occur, but when the initiator is decomposed by a high-temperature filament positioned in the vapor-phase reactor and thus the radical is formed, the monomer is activated by the radical, such that the chain polymerization reaction occurs.

The present inventors found that open pores may decrease in a state in which a porous structure in the porous dielectric material is maintained as it is by forming various kinds of polymer thin films on the surface of the porous dielectric material using the iCVD process, thereby completing the present invention.

According to a first aspect of the present invention, a method of sealing open pores on a surface of a porous dielectric material using an initiated chemical vapor deposition (iCVD) process includes:

a) positioning the porous dielectric material on a substrate; and b) thermally decomposing an initiator to form a free radical by heating while injecting vaporized monomer and initiator, and sealing the open pore on the surface of the porous dielectric material to form a polymer thin film by allowing the free radical to activate the monomer and induce a chain polymerization reaction.

According to a second aspect of the present invention, in the method of sealing open pores on a surface of a porous dielectric material using an iCVD process, step b) of the first aspect of the present invention may be repeated two times or more.

According to a third aspect of the present invention, a process of performing post-bake treatment one time or more may be added between each of the deposition steps at the time of depositing a polymer thin film by repeating step b) two times or more in the second aspect.

The first aspect of the present invention will be described in detail.

In the aspect of the present invention, step a) and step b) may be performed in a vapor-phase reactor in a vacuum chamber environment. The polymer film may be formed on the surface of the porous dielectric material by simultaneously injecting the monomer and the initiator in a vacuum chamber and activating the initiator to induce polymerization between the monomers.

In the aspect of the present invention, the vapor-phase reactor may be the vacuum chamber, and the substrate and a filament for supplying heat may be provided therein.

In the aspect of the present invention, the porous dielectric material is not limited, but may be a porous dielectric material having a dielectric constant $k_1$ satisfying the following Equation 1 and an open porosity $P_1$ satisfying the following Equation 3. Furthermore, any arbitrary layers, such as arbitrary semiconductor devices, may exist between the porous dielectric material and the substrate in the chamber.

$$1.8 \leq k_1 \leq 3.6 \qquad \text{[Equation 1]}$$

$$10\% \leq P_1 \leq 60\% \qquad \text{[Equation 3]}$$

In more detail, the porous dielectric material may be a low-k porous dielectric material having a k of 2.4 to 3.6 or an ultra low-k porous dielectric material having a k less than 2.4.

In the aspect of the present invention, the porous dielectric material may have a refractive index of 1.20 to 1.24, but is not limited thereto.

In the aspect of the present invention, the porous dielectric material is not limited as long as it is prepared using a chemical vapor deposition method or a spin-on glass method. Specific examples thereof may include a porous SiCOH thin film, porous polyarylene ether, porous silicon dioxide, and the like, but are not limited thereto.

In the aspect of the present invention, the porous dielectric material may have a pore size of 1 nm or more, more specifically, 2 to 50 nm, but is not limited thereto.

In the aspect of the present invention, preferably, the monomer and the initiator may be vaporized or sublimated to thereby be injected, and the monomer and the initiator may be mixed with each other and then injected. Alternatively, the initiator may be injected after the monomer is injected, or the monomer may be injected after the initiator is injected. Further, if necessary, the monomer and the initiator may be injected using any one or two or more carrier gases selected among Ar, $N_2$, and He.

In the aspect of the present invention, the initiator may be a material inducting activation of a first reaction in the process of the present invention so that the monomer may form a polymer. As the initiator, any material may be used without limitation as long as it may be thermally decomposed at a temperature lower than a thermal decomposition temperature of the polymer to form the free radical. In more detail, any material may be used without limitation as long as it may be thermally decomposed at 100 to 300° C. to form the free radical.

The free radical formed by decomposition of the initiator may transfer a radical to the vinyl group in the monomer to cause the chain reaction, thereby forming the polymer. A polymer material formed as described above may be deposited on the surface of the porous dielectric material. Driving force used in the polymer polymerization reaction is only a heat source used to activate the initiator, and since various kinds of monomer materials are not chemically damaged at a temperature at which the initiator is activated, conversion into the polymer thin film may be carried out in a state in which the polymer thin film also maintains various functional groups of the monomer.

In the aspect of the present invention, the initiator may be a peroxide based initiator. For example, dialkyl peroxyketal, dialkyl peroxide, di(alkylperoxy)alkylene, di(alkylperoxy)aralkylene, and a mixture thereof may be used as the initiator. In more detail, examples of the initiator may include di-tert-butyl peroxide (d-TBPO), 1,1-(t-butylperoxy)cyclohexane, 1,1-(t-butylperoxy)-3,3,5-trimethylcyclohexane, and the like, but are not limited thereto.

In the aspect of the present invention, the monomer means a unit capable of being used to form the polymer thin film on the surface of the porous dielectric material. As the monomer, any material may be used without limitation as long as it may be activated by the initiator, be vaporized in a reduced pressure and elevated temperature state, and have one or more vinyl groups. Further, it is more preferable to use a material having a low dielectric constant.

In the aspect of the present invention, the monomer may be a siloxane based monomer including at least one vinyl group, a silazane based monomer including at least one vinyl group, or an acrylic monomer. More specifically, the monomer may be any one selected among 1,3,5-trimethyl-2,4,6-trivinyl cyclotrisiloxane, 2,4,6-trimethyl-2,4,6-trivinylcyclotetrasilazane, 2,4,6,8-tetramethyl-2,4,6,8-tetravinylcyclotetrasiloxane, perfluorodecyl acrylate, cyclohexyl methacrylate, and isobornyl acrylate, or a mixture thereof. For example, in a case of mixing 1,3,5-trimetyl-1,3,5-trivinyl cyclotrisiloxane and isobornyl acrylate with each other to use the mixture, a polymer film to be formed may be made of poly(1,3,5-trimetyl-1,3,5-trivinyl cyclotrisiloxane-co-isobornyl acrylate. However, the monomer is not limited thereto.

In the aspect of the present invention, heat provided in a heat injection step for thermally decomposing the initiator may be provided by a general method capable of providing heat under a vapor-phase condition. In detail, the heat may be provided using the filament, and a temperature of the provided heat may be 100 to 300° C. more preferably 150 to 250° C. but is not limited thereto. Furthermore, during the heat injection step, temperatures of the substrate and a sample (including the porous dielectric material and other devices below the porous dielectric material) on the substrate are maintained to a lower value, which is initially set by a user.

In the aspect of the present invention, the heat is provided by a tungsten filament heated to a set temperature in the vacuum chamber environment in which the vaporized or sublimated monomer and initiator are present, such that an organic polymer dielectric layer may be formed on the dielectric material.

In the aspect of the present invention, in the forming of the free radical, the free radical may be formed by thermally decomposing the initiator through the heat injection step.

In the aspect of the present invention, in the forming of the polymer thin film, the monomer may be activated using the free radical formed by thermal decomposition, thereby making it possible to form the polymer thin film on the surface of the porous dielectric material while forming the polymer through the chain polymerization reaction of the monomer. That is, in the forming of the polymer thin film, when the free radical is formed by thermal decomposition of the initiator, the free radical may activate the monomer to induce polymerization, and this reaction may be continuously carried out, thereby forming the polymer thin film.

In the aspect of the present invention, a process of depositing the polymer thin film in step b) may be performed in a range in which the following Equations 2 and 4 are satisfied.

$$0 \leq |k_1 - k_2| \leq 1 \qquad \text{[Equation 2]}$$

In Equation 2, $k_1$ is a dielectric constant before sealing the surface, and $k_2$ is a dielectric constant after sealing the surface.

$$0\% \le P_2 \le 40\% \quad \text{[Equation 4]}$$

In Equation 4, $P_2$ is an open porosity after sealing the surface.

In the aspect of the present invention, $P_1$ and $P_2$ may satisfy $P_2 \le P_1$ and $10 \le |P_1 - P_2| \le 45$, but are not limited thereto.

In the aspect of the present invention, $k_1$ and $k_2$ may satisfy $0 \le |k_2 - k_1|/|k_1| \le 0.4$, and at the same time, $P_2$ satisfy $4\% \le P_2 \le 21\%$ in Equation 4. In more detail, $k_1$ and $k_2$ may satisfy $0 \le |k_2 - k_1|/|k_1| \le 0.2$, more preferably $0 \le |k_2 - k_1|/|k_1| \le 0.1$.

In the aspect of the present invention, as conditions for satisfying Equations 2 and 4, a substrate temperature may be 10 to 400° C. a chamber pressure may be 50 to 2500 mTorr, a deposition time may be 1 to 3600 seconds, and a thermal decomposition temperature of the initiator may be 100 to 300° C.

In the aspect of the present invention, a thickness of the polymer thin film sealing the porous dielectric material may be 0 to 20 nm in a range in which Equation 4 is satisfied, but the thickness of the polymer thin film is not limited thereto. Here, a case in which the thickness is 0 nm means a case in which the polymer thin film is not formed on the surface of the porous dielectric material but is filled in the open pores in the porous dielectric material. The thickness of the polymer thin film may be adjusted by repetitively performing step b).

Hereinafter, the second aspect of the present invention will be described in detail.

In the second aspect of the present invention, the polymer thin film may be deposited several times by repetitively performing step b) two times or more, and a repetition number of step b) is not limited.

In the aspect of the present invention, in a case in which step b) is repeated two times or more, the monomers and the initiators used in each of the deposition steps may be entirely or partially equal to each other, or different from each other.

In the aspect of the present invention, in the case in which step b) is repeated two times or more, process conditions applied to each of the deposition steps may be entirely or partially equal to each other, or different from each other.

According to the third aspect of the present invention, the process of performing post-bake treatment one time or more may be added between each of the deposition steps at the time of depositing a polymer thin film by repeating step b) two times or more in the second aspect. That is, the method of sealing open pores may further include, after step b), c) performing post-bake treatment, and then, step b) and step c) may be repeated.

Alternatively, step b) may be repeated two times or more, post-bake treatment may be performed as step c), and then step b) may be repeated two times or more, and a repetition number of post-bake treatment is not limited.

In the aspect of the present invention, post-bake treatment may be performed in order to remove the monomer and the oligomer that are not completely polymerized depending on process conditions during the process of forming the polymer thin film on a surface layer of the porous dielectric material, and changes in dielectric constant and porosity of the porous dielectric material may be minimized by the process of performing post-bake treatment.

In the aspect of the present invention, post-bake treatment may be performed at 60 to 400° C. for 1 to 30 minutes under an air, vacuum, Ar, or $N_2$ atmosphere, but is not limited thereto.

Hereinafter, the present invention will be described in detail through Examples and Comparative Examples. However, the following Examples and Comparative Examples are only to specifically explain the present invention, but the present invention is not limited thereto.

Hereinafter, physical properties were measured by the following methods.

1) Thickness

Entire thicknesses of a pristine ULK dielectric film and a porous dielectric material on which a pore sealing layer was formed were measured using spectroscopic ellipsometry (Manufacturer: J. A. Woollam Co., model name: M-2000D).

2) Open Porosity

An open porosity was measured using ellipsometric porosimetry (Manufacturer: SemiLab Co. Ltd., model name: SOPRA EP5).

This method, which is a measurement method in which spectroscopic ellipsometry is combined with a system capable of adsorbing a vaporized solvent on a sample, is a method capable of calculating an open porosity of the sample by measuring optical characteristics changed at the time of adsorbing a solvent vapor on the sample and desorbing the solvent vapor from the sample. As the solvent, toluene was used.

3) Effective Dielectric Constant ($k_{eff}$)

After forming platinum (Pt) dots on the pristine ULK dielectric film and the porous dielectric material on which the pore sealing layer was formed, capacitances of the porous dielectric material were measured using a precision LCR meter (Manufacturer: Agilent Technologies, E4980A Precision LCR Meter), and an effective dielectric constant $k_{eff}$ was calculated using the thickness measured as described above and a dot area.

Examples 1 to 9

As a porous dielectric material, a porous SiCOH thin film having ultra low-k (ULK) characteristics was used, and a polymer thin film was formed using an iCVD process.

The used ultra low-k porous SiCOH thin film was deposited on a Si substrate at a thickness of 90 nm, and had a k of 2.0 and an open porosity of 45%. Further, a refractive index was 1.22.

As a monomer, 1,3,5-trimethyl-2,4,6-trivinyl cyclotrisiloxane (V3D3) was used, and as an initiator, di-tert-butyl peroxide (d-TBPO) was used.

The iCVD process was performed at a filament temperature of 200° C. The monomer was injected into a chamber at a flow rate of 2.7 sccm, and the initiator was injected into the chamber at a flow rate of 1.3 sccm. A substrate temperature and a process pressure were variously changed as illustrated in the following Table 1, and thicknesses, open porosities, and dielectric constants were calculated and illustrated in the following Table 1.

TABLE 1

| # | $T_{substrate}$ (° C.) | $P_{chamber}$ (mTorr) | Deposition time (sec) | Thickness (nm) | Open porosity (%) | $k_{eff}$ |
|---|---|---|---|---|---|---|
| 0 | Pristine ULK dielectric film | | | 89 | 45.0 | 2.00 |
| 1 | 40 | 300 | 600 | 112 | 4.2 | 2.73 |

TABLE 1-continued

| # | $T_{substrate}$ (° C.) | $P_{chamber}$ (mTorr) | Deposition time (sec) | Thickness (nm) | Open porosity (%) | $k_{eff}$ |
|---|---|---|---|---|---|---|
| 2 | 90 | 500 | 600 | 96 | 12.2 | 2.46 |
| 3 | 90 | 900 | 200 | 93 | 7.1 | 2.44 |
| 4 | 120 | 500 | 600 | 90 | 20.2 | 2.38 |
| 5 | 120 | 900 | 600 | 94 | 17.7 | 2.33 |
| 6 | 120 | 1500 | 600 | 103 | 10.1 | 2.40 |
| 7 | 180 | 2500 | 600 | 89 | 19.5 | 2.34 |
| 8 | 250 | 500 | 1800 | 89 | 19.9 | 2.30 |
| 9 | 250 | 300 | 3600 | 90 | 15.6 | 2.27 |

Table 1 illustrates results of measuring the thicknesses, the porosities, and the effective dielectric constants $k_{eff}$ of the ULK dielectric films after the pore sealing layer was formed depending on various iCVD process conditions, that is, the substrate temperature $T_{substrate}$, the process pressure $P_{chamber}$, and a deposition time.

As illustrated in Table 1, it may be appreciated that ULK dielectric films having various characteristics may be provided after forming the pore sealing layer depending on the iCVD process conditions.

First, it may be appreciated that the lower the substrate temperature, the more effective in decreasing the open porosity. For example, in Example 1 in which the substrate temperature was 40° C. the open porosity after forming the pore sealing layer was 4.2%, which was the lowest value. However, in the case in which the substrate temperature was increased to 120° C. or more to perform deposition, in most of the cases, the open porosity was 10% or more.

Further, it may be appreciated that the lower the substrate temperature, the faster the deposition rate of the polymer, such that a thickness increase rate of the entire film is increased. For example, it may be appreciated that the process pressure and the deposition time in Example 2 were 500 mTorr and 600 seconds, respectively, which were the same as those in Example 4, and the thickness of the film in Example 4 in which the substrate temperature was 120° C. as 90 nm, which was almost the same as that of the pristine ULK dielectric film, but the thickness of the film in Example 2 in which the substrate temperature was 90° C. as 96 nm, which was relatively thick.

Further, it is possible to effectively decrease the open porosity while minimizing an increase in the entire thickness of the film by selecting a suitable process temperature and pressure as in Examples 7 and 8. In this case, the polymer thin film was partially formed inwardly from a surface of a porous thin film, which may be inferred from the fact that the open porosity was decreased and the $k_{eff}$ was increased even though the entire thickness was not increased.

Experimental Example 1

Physical properties were evaluated using Example 1, and the results were illustrated in FIGS. 1 to 6.

Figure 1B:
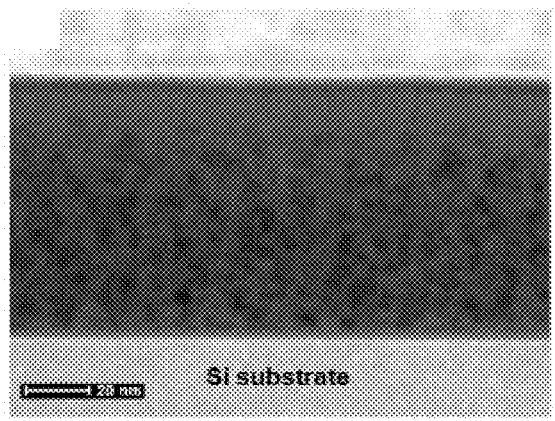

FIGS. 1A and 1B are scanning transmission electron microscopy (STEM) images in which it may be confirmed that a polymer thin film was formed on a surface of a porous dielectric material. FIG. 1A illustrates a pristine ULK dielectric film and FIG. 1B illustrates a pV3D3 sealed ULK dielectric film. As illustrated in FIGS. 1A and 1B, it may be confirmed that before the pore sealing layer was formed, the entire ULK dielectric film was porous, but after the pore sealing layer was formed, an upper end of the film was effectively densified by pV3D3.

Figure 2A:
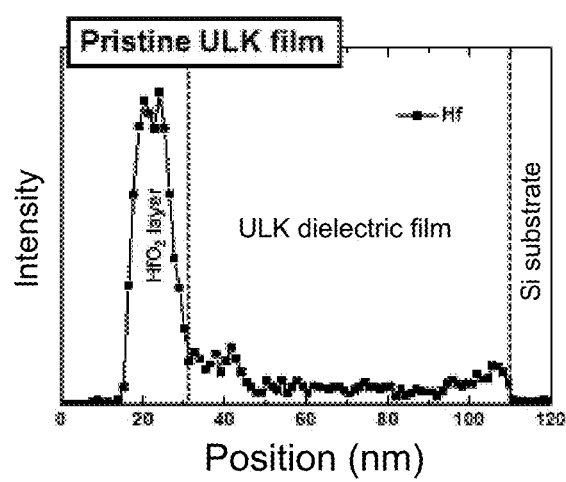
FIGS. 2A and 2B illustrate results obtained by observing a phenomenon that Hf precursors penetrate into ultra low-k (ULK) dielectric films during atomic layer deposition (ALD) of $HfO_2$ on pristine and pore sealed ULK dielectric films.
Figure 2B:
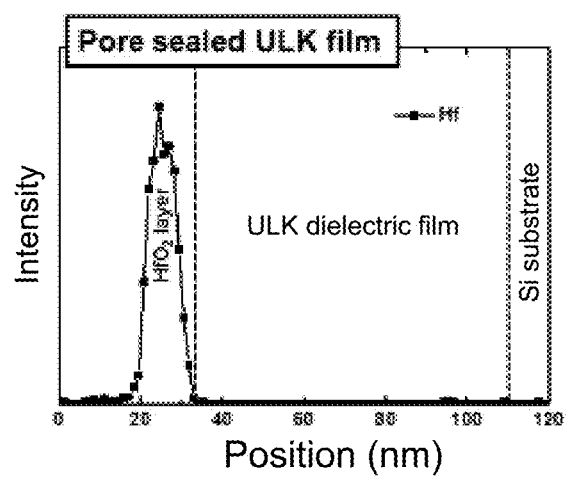

FIGS. 2A and 2B illustrate results obtained by observing a phenomenon that an Hf precursor penetrates into ultra low-k (ULK) dielectric films at the time of performing atomic layer deposition (ALD) of $HfO_2$ on a pristine ULK dielectric film and a pore sealed ULK dielectric film.

ALD conditions of $HfO_2$ were as follows. A deposition temperature was 350° C. a pressure was 0.7 Torr, and tetrakis(ethylmethylamino) hafnium (TEMAHf) and $O_3$ were used as gases.

ALD of $HfO_2$ was performed on two samples so as to have a target thickness of 10 nm. As a result of energy dispersive spectroscopy (EDS) analysis, it may be appreciated that in the pristine ULK dielectric film, Hf was observed in the entire ULK dielectric film, but in the pore sealed ULK dielectric film, the Hf precursor did not penetrate. Therefore, it may be confirmed that the pV3D3 pore sealing layer effectively decreased the open porosity of the film, thereby effectively blocking penetration of an Hf precursor.

Figure 3:
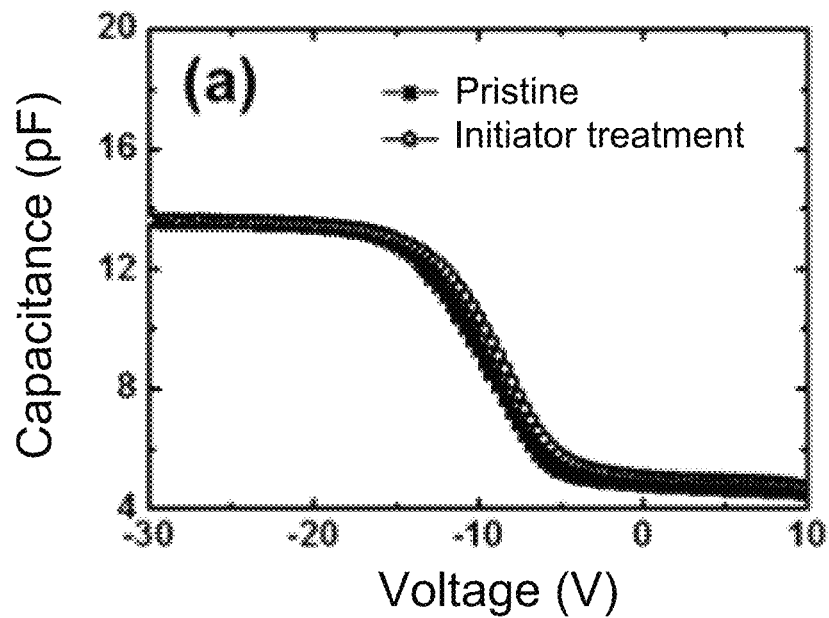
FIG. 3 is a graph illustrating capacitance-voltage characteristic of pristine and initiator treated ULK dielectric materials.

FIG. 3 is a graph illustrating capacitance-voltage characteristic of pristine and initiator treated ULK dielectric materials.

Figure 4:
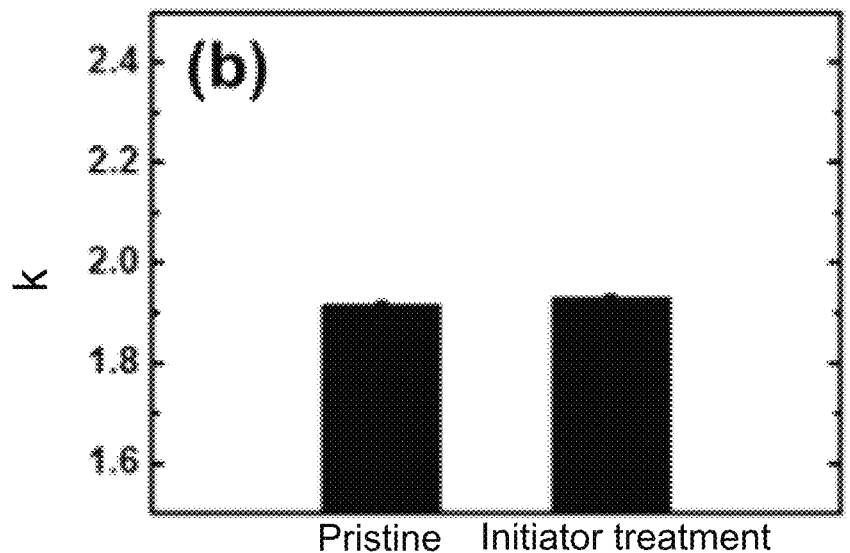
FIG. 4 is a graph illustrating dielectric constants of the pristine and initiator treated ULK dielectric materials.

FIG. 4 is a graph illustrating dielectric constant of pristine and initiator treated ULK dielectric materials.

FIG. 5 is a graph illustrating open porosities of pristine and initiator treated ULK dielectric materials.

FIGS. 6A and 6B illustrate Fourier transform-infrared (FT-IR) spectra of the pristine and initiator treated ULK dielectric materials.

As illustrated in FIGS. 3 to 6B, when the ULK dielectric material was treated with an activated initiator, the dielectric constant, the porosity, the refractive index, or the like, of the film was hardly changed, such that it may be considered that the film was hardly damaged by the initiator treatment. This fact may be also confirmed through the capacitance-voltage characteristics. Further, it may be confirmed through Fourier transform infrared spectroscopy (FT-IR) analysis that functionality of the ULK dielectric material was hardly changed. Therefore, it may be appreciated that the iCVD process was a method capable of forming a pore sealing layer while hardly changing characteristics of the ULK dielectric material itself as compared to the existing processes.

Example 10

An iCVD process was performed in the same manner as in Example 1 except that post-bake (referred to as 'PB') treatment was performed after performing an iCVD process for depositing a polymer thin film, this process was repeated 5 times, and each of the deposition times was 10 seconds.

The post-bake treatment was performed at 200 for 15 minutes.

A thickness of the pristine ULK dielectric film was 89.2 nm, $k_{eff}$ thereof was 1.98, and after a fifth deposition process was performed, a thickness (denoted by #5) was 102.5 nm, and $k_{eff}$ was 2.34. After performing post-bake (PB) treatment after the fifth deposition process, a thickness (denoted by #5_PB) was 102.4 nm, and $k_{eff}$ was 2.33.

Figure 7:
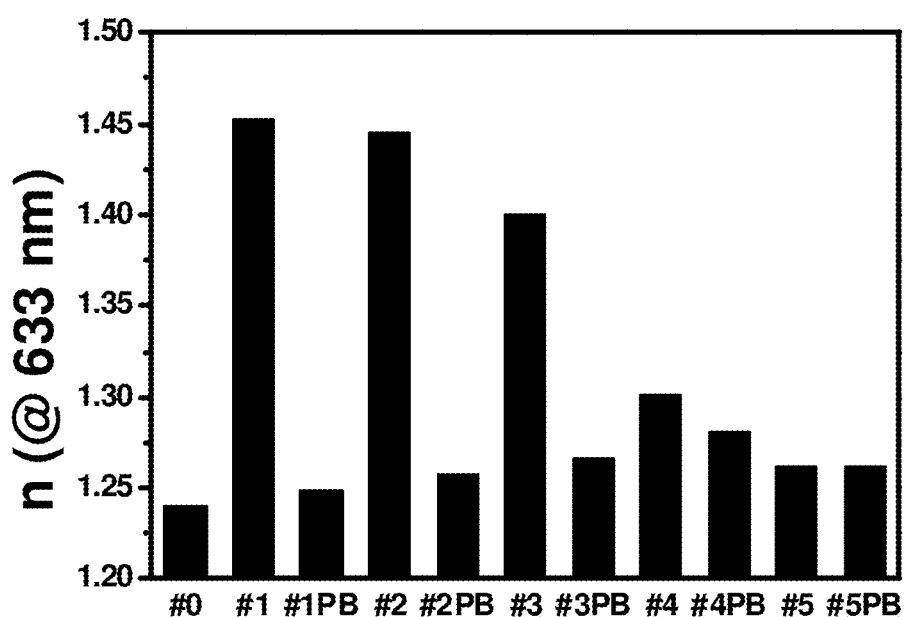
FIG. 7 illustrates a change in refractive index depending on repetition of deposition and post-bake treatment of the polymer thin film.

FIG. 7 illustrates a change in refractive index depending on repetition of deposition and post-bake treatment of the polymer thin film.

0 indicates a refractive index of the pristine ULK dielectric film. It may be confirmed that in a case in which the iCVD process and the post-bake process were performed on the pristine ULK dielectric film having a refractive index of 1.241 once, the refractive index of the film was increased to 1.453 but was decreased to 1.249 again. This may be interpreted that monomers and oligomers were trapped in pores of a lower end of a sealing layer while forming the pore sealing layer on a surface through the iCVD process, but at the time of performing the post-bake process, the trapped monomers and oligomers passed through the pore sealing layer positioned above to thereby be released. In this case, an open porosity of the film was about 6% after performing the iCVD process, but after performing the post-bake process, the open porosity of the film was about 20 to 30%. Considering that a porosity of the pristine ULK dielectric material was about 45%, the result described above means that the pore sealing layer on the surface still served to decrease the porosity to some extent even after the post-bake process. In a case of repetitively performing the iCVD process, a phenomenon that the refractive index was decreased by post-bake treatment after the refractive index was increased was repetitively observed. However, it may be confirmed that the change in refractive index was continuously decreased, and thus, the porosity after post-bake treatment was also gradually decreased. It may be confirmed that the refractive index was not changed any more after a predetermined point in time.

In this case, a fixed refractive index was about 1.26 or so. Considering that the refractive index of the pristine ULK dielectric film was about 1.24 or so, and a refractive index of the pV3D3 material itself was about 1.47 or so, it may be appreciated that it is possible to effectively decrease an open porosity while maintaining a closed porosity, that is, a portion occupied by pores which were not connected to the outside to thereby be inaccessible to foreign materials through a multi-step deposition strategy method.

Example 11

An iCVD process was performed under the same conditions as in Example 9 except for using 2,4,6,8-tetramethyl-2,4,6,8-tetravinylcyclotetrasiloxane (V4D4) instead of 1,3,5-trimethyl-2,4,6-trivinyl cyclotrisiloxane(V3D3) as a monomer.

As a result, an open porosity was 14.7%, and an effective dielectric constant ($k_{eff}$) was 2.32.

Example 12

An iCVD process was performed by the same method as in Example 1 except that 2,4,6,8-tetramethyl-2,4,6,8-tetravinylcyclotetrasiloxane (V4D4) was used as a monomer, a substrate temperature was 120° C. a process pressure was 2500 mTorr, and a deposition time was 60 seconds.

As a result, an open porosity was 13.8%, and an effective dielectric constant ($k_{eff}$) was 2.35.

Example 13

An iCVD process was performed by the same method as in Example 1 except that 1,3,5-trimethyl-2,4,6-trivinyl cyclotrisiloxane (V3D3) was used as a monomer, a substrate temperature was 120° C. a process pressure was 2500 mTorr, and a deposition time was 60 seconds.

As a result, an open porosity was 15.1%, and an effective dielectric constant ($k_{eff}$) was 2.34.

In Example 13, the kind of monomer was changed as compared to Example 12, and it was confirmed that in the case of using V3D3, the open porosity was high and the effective dielectric constant ($k_{eff}$) was low as compared to the case of using V4D4.

Example 14

An iCVD process was performed by the same method as in Example 1 except that 2,4,6,8-tetramethyl-2,4,6,8-tetravinylcyclotetrasiloxane (V4D4) was used as the monomer, a substrate temperature was 120° C. a process pressure was 2500 mTorr, and a deposition time was 120 seconds.

As a result, an open porosity was 9.5%, and an effective dielectric constant ($k_{eff}$) was 2.42.

Example 15

An iCVD process was performed by the same method as in Example 1 except that 1,3,5-trimethyl-2,4,6-trivinyl cyclotrisiloxane (V3D3) was used as a monomer, a substrate temperature was 120° C. a process pressure was 2500 mTorr, and a deposition time was 120 seconds.

As a result, an open porosity was 12.8%, and an effective dielectric constant ($k_{eff}$) was 2.4.

In Example 15, the kind of monomer was changed as compared to Example 14, and it was confirmed that in the case of using V3D3, the open porosity was high and the effective dielectric constant ($k_{eff}$) was low as compared to the case of using V4D4.

Example 16

An iCVD process was performed by the same method as in Example 1 except that 1,3,5-trimetyl-1,3,5-trivinyl cyclotrisiloxane (V3D3) and isobornyl acrylate (IBA) were simultaneously used as monomers, a substrate temperature was 40° C. a process pressure was 350 mTorr, a deposition time was 246 seconds, and flow rates of 1,3,5-trimetyl-1,3,5-trivinyl cyclotrisiloxane (V3D3), isobornyl acrylate (IBA), and di-tert-butyl peroxide (d-TBPO) were 3.64 sccm, 0.61 sccm, and 1.46 sccm, respectively.

As a result, an open porosity was 6.8%, and an effective dielectric constant ($k_{eff}$) was 2.56.

Example 17

An iCVD process was performed by the same method as in Example 1 except that 1,3,5-trimetyl-1,3,5-trivinyl cyclotrisiloxane (V3D3) and isobornyl acrylate (IBA) were simultaneously used as monomers, a substrate temperature was 40° C. a process pressure was 350 mTorr, a deposition time was 123 seconds, and flow rates of 1,3,5-trimetyl-1,3,5-trivinyl cyclotrisiloxane (V3D3), isobornyl acrylate (IBA), and di-tert-butyl peroxide (d-TBPO) were 3.64 sccm, 0.61 sccm, and 1.46 sccm, respectively.

As a result, an open porosity was 5.8%, and an effective dielectric constant ($k_{eff}$) was 2.57.

In Example 17, the deposition time was changed as compared to Example 16, it was confirmed that the open porosity was low and the effective dielectric constant ($k_{eff}$) was high.

In the method of sealing open pores according to the present invention, since the polymer thin film having a significantly thin thickness may be formed by a solvent-free vapor deposition method without plasma treatment, it is possible to minimize deterioration of characteristics of the dielectric material vulnerable to plasma and a chemical solution.

Further, this method may satisfy requirements that a thermal budget of a back-end of line (BEOL) required in a semiconductor industry is 400° C. or less.

Furthermore, in methods of sealing a pore using atomic layer deposition (ALD), chemical vapor deposition (CVD), or self-assembled monolayer (SAM) according to the related art, mostly, a plasma process is performed, but energetic ions, ultra-violet (UV), radical species generated in the plasma may damage a porous dielectric material. On the contrary, according to the present invention, since the iCVD process is used, and only the monomer for forming the polymer layer and the radical for initiating polymerization are present, damages of the porous dielectric material may be significantly decreased.

In addition, low dielectric constant characteristics of the porous dielectric material may be maintained as it is by forming a significantly thin pore sealing layer through optimization of the deposition conditions. Further, in the case of selecting and using monomers having a lower k value at the time of forming the polymer, degradation of low dielectric constant characteristics caused by a pore sealant may be significantly decreased.

In addition, step coverage may be excellent due to surface-growing mechanism of iCVD, such that the method may be significantly suitable for a semiconductor back-end process interconnect structure having a large aspect ratio.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method of sealing open pores on a surface of a porous dielectric material using an initiated chemical vapor deposition (iCVD) process without plasma treatment, the method comprising:
   a) providing a substrate having the porous dielectric material, the substrate being disposed in a chamber; and
   b) repetitively, two or more times, thermally decomposing an initiator while injecting the initiator into said chamber to activate the initiator and form a free radical by heating while simultaneously injecting a vaporized monomer into said chamber, whereby a polymer thin film is formed by allowing the free radical to activate the monomer and induce a chain polymerization reaction, wherein the polymer thin film achieves a desired thickness over the surface of the porous dielectric material and seals open pores on the surface of the porous dielectric material and at least some of the polymer thin film is formed inwardly into some of the pores on the surface of the porous dielectric material;
   wherein in the porous dielectric material, a dielectric constant $k_1$ before sealing the surface, and a dielectric constant $k_2$ after sealing the surface satisfy the following Equations 1 and 2, and
   an open porosity $P_1$ before sealing the surface and open porosity $P_2$ after sealing the surface satisfy one of the following Equations 3-4;

$$1.8 \leq k_1 \leq 3.6; \qquad \text{Equation 1,}$$

$$0 \leq |k_1 - k_2| \leq 1; \qquad \text{Equation 2,}$$

$$10\% \leq P_1 \leq 60\%; \text{ and} \qquad \text{Equation 3,}$$

$$0\% \leq P_2 \leq 40\%, \qquad \text{Equation 4.}$$

2. The method of claim 1, wherein step a) and step b) are performed in said chamber that is a vapor-phase reactor that presents a vacuum chamber environment.

3. The method of claim 2, wherein a substrate temperature is 10 to 400° C., a chamber pressure is 50 to 2500 mTorr, a deposition time is 1 to 3600 seconds, and a thermal decomposition temperature of the initiator is 100 to 300° C.

4. The method of claim 1, wherein the initiator is a peroxide based initiator, and
   the monomer is a siloxane based monomer including at least one vinyl group, a silazane based monomer including at least one vinyl group, or an acrylic monomer.

5. The method of claim 4, wherein the monomer is any one selected among 1,3,5-trimethyl-2,4,6-trivinyl cyclotrisiloxane, 2,4,6-trimethyl-2,4,6-trivinylcyclotetrasilazane, 2,4,6,8-tetramethyl-2,4,6,8-tetravinylcyclotetrasiloxane, perfluorodecyl acrylate, cyclohexyl methacrylate, and isobornyl acrylate, or a mixture thereof.

6. The method of claim 1, wherein in step b), at the time of injecting a vaporized or sublimated monomer and initiator, any one or two or more carrier gases selected among Ar, $N_2$, and He are used.

7. The method of claim 1, further comprising, after step b), performing post-bake treatment at 60 to 400° C.

8. The method of claim 1, further comprising performing post-bake treatment at 60 to 400° C. between each of the polymer thin film form step at the time of repeating step b) two times or more.

* * * * *